US012203985B1

(12) United States Patent
Jain et al.

(10) Patent No.: US 12,203,985 B1
(45) Date of Patent: Jan. 21, 2025

(54) TEST-TIME OPTIMIZATION WITH FEW SLOW SCAN PADS

(71) Applicant: STMicroelectronics International N.V., Geneva (CH)

(72) Inventors: Sandeep Jain, Noida (IN); Shalini Pathak, Haryana (IN); Pooja Jain, Sahibabad (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/222,535

(22) Filed: Jul. 17, 2023

(51) Int. Cl.
  *G01R 31/3185* (2006.01)
  *G01R 31/317* (2006.01)

(52) U.S. Cl.
  CPC ......... *G01R 31/318552* (2013.01); *G01R 31/31727* (2013.01); *G01R 31/318536* (2013.01)

(58) Field of Classification Search
  None
  See application file for complete search history.

(56) References Cited

U.S. PATENT DOCUMENTS

| | | | |
|---|---|---|---|
| 10,444,280 B2 | 10/2019 | Jayaraman et al. | |
| 10,746,795 B2 | 8/2020 | Sofer et al. | |
| 2001/0051404 A1* | 12/2001 | Hiroshi | G01R 31/318538 438/202 |
| 2005/0138499 A1* | 6/2005 | Pileggi | G01R 31/2884 714/724 |
| 2005/0222795 A1* | 10/2005 | Rodgers | G01R 31/31858 702/117 |
| 2005/0229056 A1* | 10/2005 | Rohrbaugh | G01R 31/318566 714/726 |
| 2011/0179325 A1 | 7/2011 | Gupta et al. | |
| 2012/0110402 A1* | 5/2012 | Wang | G01R 31/318558 714/E11.155 |
| 2012/0221906 A1* | 8/2012 | Shetty | G01R 31/3177 714/E11.155 |
| 2013/0246874 A1* | 9/2013 | Whetsel | G01R 31/3177 714/729 |
| 2015/0185283 A1 | 7/2015 | Mittal et al. | |
| 2015/0276871 A1* | 10/2015 | Ren | G01R 31/31704 714/727 |
| 2020/0124666 A1* | 4/2020 | Yung | G01R 31/3177 |
| 2020/0386808 A1 | 12/2020 | Makkar et al. | |

OTHER PUBLICATIONS

S. Sunter and M. Tilmann, "BIST of I/O circuit parameters via standard boundary scan," 2010 IEEE International Test Conference, Austin, TX, USA, 2010, pp. 1-10, doi: 10.1109/TEST.2010.5699207. (Year: 2010).*

Shanmugasundaram, Priyadharshini: "Test Time Optimization in Scan Circuits," Auburn University Thesis, Dec. 13, 2010, 114 pgs.

* cited by examiner

*Primary Examiner* — Daniel F. McMahon
(74) *Attorney, Agent, or Firm* — Crowe & Dunlevy LLC

(57) ABSTRACT

An integrated circuit improves scan testing efficiency by addressing slow Scan-OUT pins. The integrated circuit shifts data through high-frequency Scan-OUT pins every cycle and through low-frequency Scan-OUT pins every other cycle. Data that cannot be shifted through low-frequency pins is stored in an accumulator and later shifted out through high-frequency pins. Despite changing the scan-out data pattern, the tester used for testing the integrated circuit anticipates the resulting pattern, providing for the testing to not be negatively impacted.

16 Claims, 5 Drawing Sheets

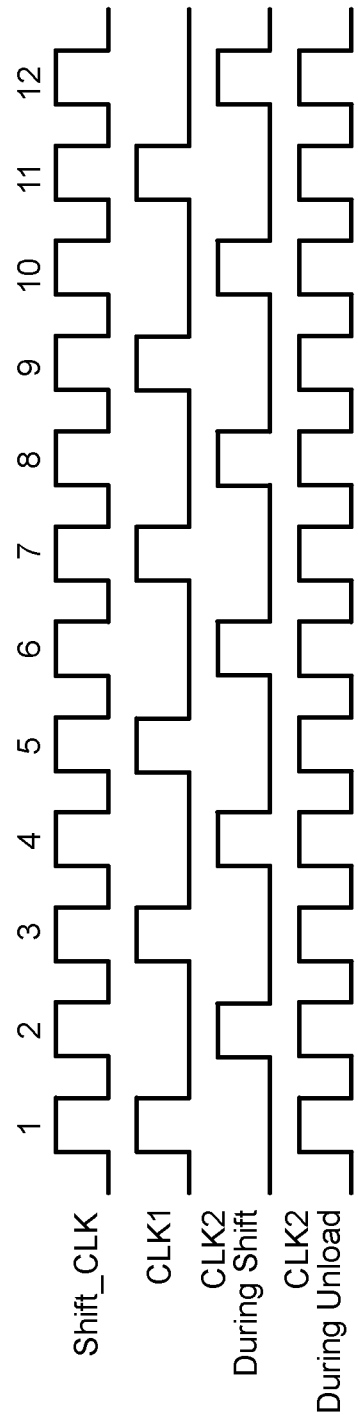

| Total Scan_OUT pads | Slow pad | Chain Unload time ns (prior art) | Chain Unload time ns | Accumulator Unload time ns | Savings % |
|---|---|---|---|---|---|
| 20 | 1 | 2000 | 1000 | 30 | 48.5 |
| | 2 | | | 60 | 47 |
| | 3 | | | 90 | 45.5 |
| | 4 | | | 130 | 43.5 |
| | 5 | | | 170 | 41.5 |
| | 6 | | | 220 | 39 |
| | 7 | | | 270 | 36.5 |
| | 8 | | | 340 | 33 |
| | 9 | | | 410 | 29.5 |
| | 10 | | | 500 | 25 |

Chain length: 100
Fast pad frequency: 100mHz (10ns)
Slow pad frequency: 50mHz (20ns)

FIG. 6

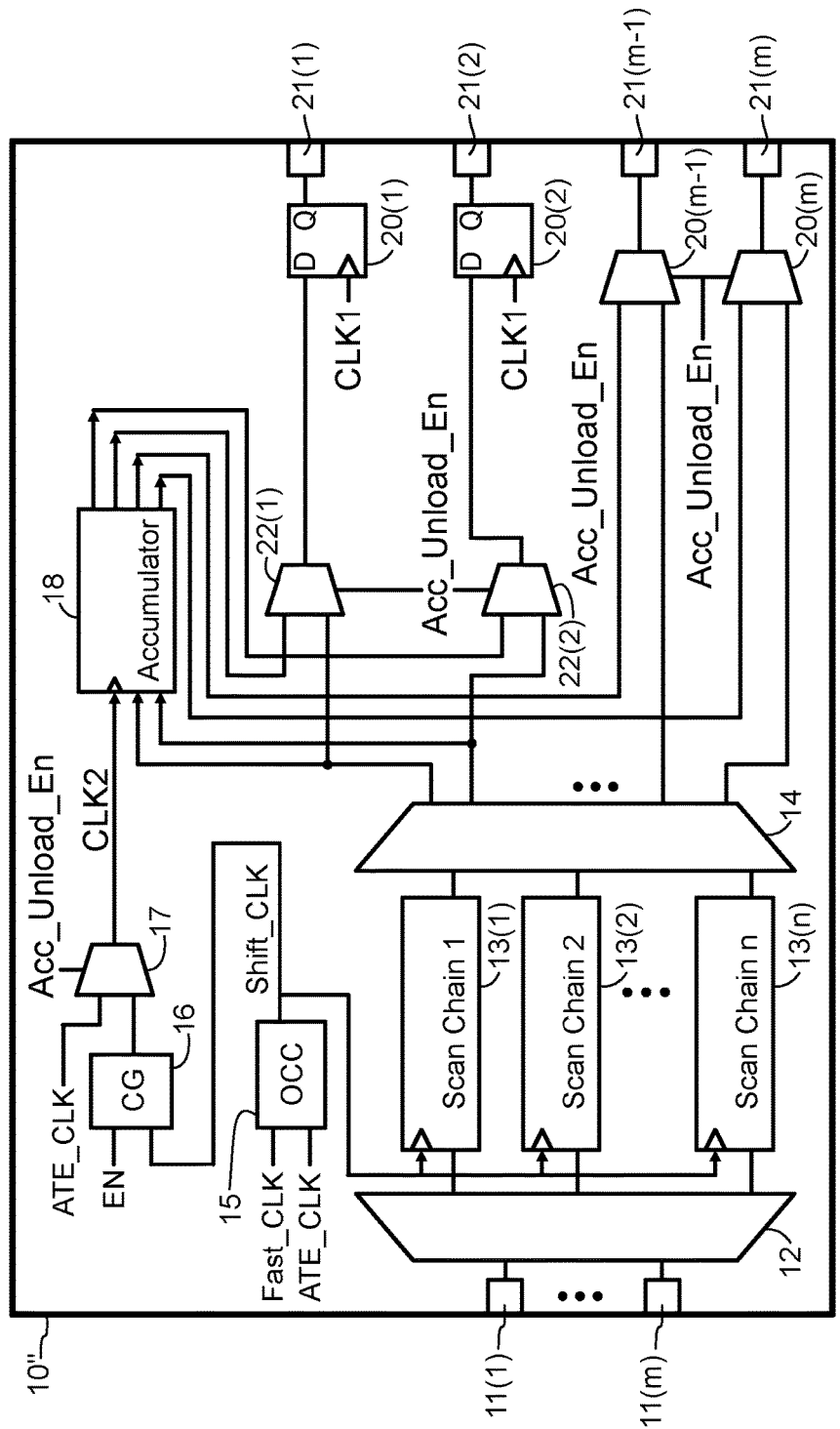

TEST-TIME OPTIMIZATION WITH FEW SLOW SCAN PADS

TECHNICAL FIELD

This disclosure relates to the optimization of scan shift time in an IC designed for test (DFT), and, in particular, to the management of slow scan-out pads to decrease the scan shift time.

BACKGROUND

Scan testing is a hardware-level technique for evaluating integrated circuits (ICs). As illustrated in FIG. 1, an IC 10, designed to perform scan testing, incorporates n scan chains 13(1), . . . , 13(n). These chains are sequences of flip flops with reconfigurable connections that serve standard roles within the IC 10, such as maintaining state information. However, when the IC 10 enters test mode, these flip flops are logically realigned to form the scan chains 13(1), . . . , 13(n). This allows for direct manipulation and monitoring of the states of the flip flops. By shifting data, known as 'scan-shifting', in and out of the scan chains 13(1), . . . , 13(n), a snapshot of the IC 10's internal state can be captured and examined, which is particularly beneficial in identifying manufacturing defects or design errors.

With the growing complexity of IC designs, the need for rigorous testing and implementation of new fault models has intensified, especially in sectors desiring high reliability, such as the automotive sector. This has led to a significant increase in scan volume—the total data necessary for scan testing—and consequently, the need for greater scan compression. Scan compression pertains to the on-chip scan decompressor logic 12, which expands compressed scan patterns (received at m Scan-IN pads) as they are fed into the scan chains 13(1), . . . , 13(n), and to the on-chip compressor logic 14 which compresses the data as it is scan-shifted out (to m Scan-OUT pads) from the scan chains 13(1), . . . , 13(n).

As scan volumes grow, so does the testing time for each IC 10, thereby escalating testing costs as well as the time taken to perform such testing.

The testing procedure is shaped by the scan compression process and the number of available I/O pads for use as Scan-IN and Scan-OUT pads. Having more I/O pads can lead to better compression, shorter scan chain lengths, and fewer scan patterns. However, the frequency at which data is scan-shifted, of interest for effective testing, is often constrained by the utilization of certain slower Scan-OUT pads due to external loads. If certain Scan-OUT pads have a lower maximum drive capability, it proportionally reduces the overall scan-shift frequency. For instance, if nine Scan-OUT pads can support a maximum scan-shift of 100 MHz, and one Scan-OUT pad can only support a maximum scan-shift of 50 MHz, the entire scan-shift operation is limited to 50 MHz. This further adds to the testing time and costs in an undesirable fashion. Further development is therefore needed to address this limitation and increasing the scan-shift frequency.

SUMMARY

The design described herein provides for efficient handling of slow scan-out pads to thereby decrease the time for performing scan testing. Assume that certain scan data will be shifted through corresponding scan chains and out through associated Scan-OUT pins that operate at a higher frequency, while certain data will be shifted through corresponding scan chains and out through associated Scan-OUT pins that operate at a lower frequency. The technique described herein involves the unloading of all scan chains at the higher frequency. For those scan chains associated with Scan-OUT pins operating at the lower frequency, scan data is shifted out through those pins every other cycle instead of every cycle as with the scan data from scan chains associated with Scan-OUT pins that operate at the higher frequency. The data that could not be shifted out through the Scan-OUT pins operating at the lower frequency is temporarily stored in an accumulator. Additional cycles, during shift, are utilized to shift out this accumulated data through the Scan-OUT pins that operate at the higher frequency. While this results in the production of a different pattern of scan out data, the tester has advance knowledge of what the expected resulting pattern of scan out data will be, and therefore testing is not negatively impacted.

BRIEF DESCRIPTION OF THE DRAWINGS

FIG. 3 is a timing diagram showing the relationship between the different clock signals in the scan testing circuit of the IC of FIG. 2.

FIG. 4 is a table showing data shifted out through both the fast and slow Scan_OUT pads of the IC of FIG. 2 during an initial portion of a scan-shift procedure, and showing data saved in the accumulator during this initial portion of the scan-shift procedure.

FIG. 5 is a table showing data shifted out through the slow Scan_OUT pads of the OC of FIG. 2 during a final portion of the scan-shift procedure.

FIG. 6 is a table showing testing time savings of the IC disclosed herein as opposed to a prior art IC when performing the scan-shift procedure.

FIG. 7 is a block diagram of another IC disclosed herein including an improved scan testing circuit that facilitates scan out in a quicker time than would otherwise be supported by the frequency of the slowest scan out pad.

FIG. 8 is a table showing data shifted out through the slow Scan_OUT pads of the OC of FIG. 7 during a final portion of the scan-shift procedure.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Figure 1:
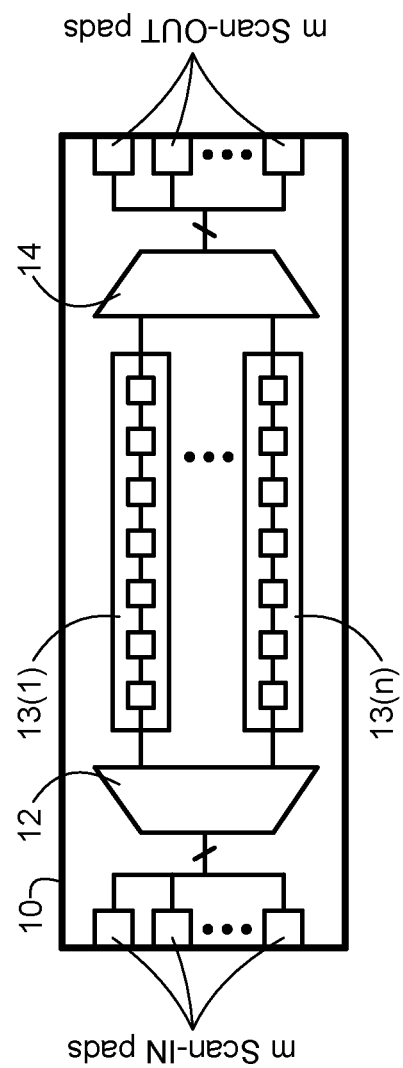
FIG. 1 is a block diagram of a prior art IC including a known scan testing circuit.
Figure 2:
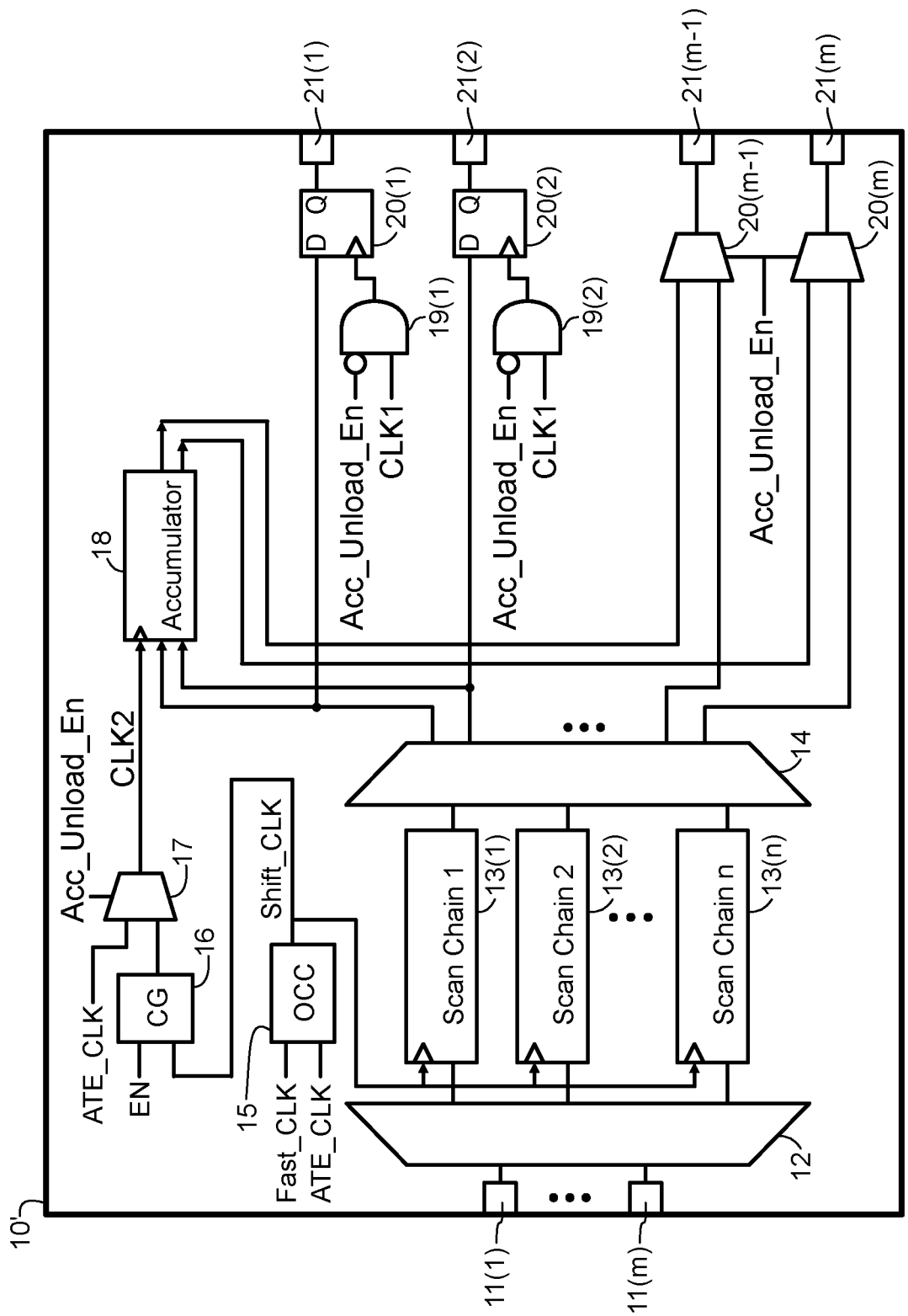
FIG. 2 is a block diagram of an IC disclosed herein including an improved scan testing circuit that facilitates scan out in a quicker time than would otherwise be supported by the frequency of the slowest scan out pad.

Now described with reference to FIG. 2 is an integrated circuit 10' including n scan chains 13(1), . . . , 13(n). There are m Scan-IN pads 11(1), . . . , 11(m) configured to receive compressed input scan data and provide that compressed input scan data to a scan decompressor 12 which decompresses the compressed input scan data for passage through the scan chains 13(1), . . . , 13(n). A scan compressor 14 compresses the scan data as it is shifted out through the scan chains 13(1), ..., 13(*n*) as output scan data, scan chains 13(1), ..., 13(*n*) being clocked by a shift clock signal Shift_CLK.

There are m Scan-OUT pads 21(1), ..., 21(*m*), with m being less than n. In this integrated circuit 10', Scan-OUT pads 21(*m*−1) and Scan-OUT pad 21(*m*) are operable at a maximum frequency equal to a first frequency while Scan-OUT pad 21(1) and Scan-OUT pad 21(2) are operable at a maximum frequency equal to a second frequency lower than the first frequency. The second frequency may be one half the first frequency, for example.

A multiplexer 20(*m*−1) receives an m−1th portion of the output scan data from the scan compressor 14 at its first input and receives the output from accumulator 18 at its second input, and passes the data at its second input to the Scan-OUT pad 21(*m*−1) when an accumulator unload signal Acc_Unload_En is asserted but otherwise passes the data at its first input to the Scan-OUT pad 21(*m*−1). A multiplexer 20(*m*) receives an mth portion of the output scan data from the scan compressor 14 at its first input and receives the output from accumulator 18 at its second input, and passes the data at its second input to the Scan-OUT pad 21(*m*) when the accumulator unload signal Acc_Unload_En is asserted but otherwise passes the data at its first input to the Scan-OUT pad 21(*m*).

A flip flop 20(1) receives the first portion of the output scan data from the scan compressor 14 at its data input and passes this data to the Scan-OUT pad 21(1) when clocked. The flip flop 20(1) is clocked by the output from an AND gate 19(1). The AND gate 19(1) receives an inverse of the accumulator unload signal Acc_Unload_En at its first input and a first clock signal CLK1 at its second input and clocks the flip flop 20(1) based performing a logical AND operation on these two logic values. A flip flop 20(2) receives the second portion of the output scan data from the scan compressor 14 at its data input and passes this data to the Scan-OUT pad 21(2) when clocked. The flip flop 20(2) is clocked by the output from an AND gate 19(2). The AND gate 19(2) receives an inverse of the accumulator unload signal Acc_Unload_En at its first input and the first clock signal CLK1 at its second input, and clocks the flip flop 20(2) performing a logical AND operation on these two logic values.

It should be understood that for each Scan-OUT pad 21(1), ..., 21(*m*), there is a corresponding logic device driving that Scan-OUT pad. For slow Scan-OUT pads, which in the illustrated example are 21(1) and 21(2), the logic devices driving those Scan-OUT pads are flip flops 20(1) and 20(2). For fast Scan-OUT pads, which in the illustrated example are 21(*m*−1) and 21(*m*), the logic devices driving those Scan-OUT pads are multiplexers 20(*m*−1) and 20(*m*). There may be any number of Scan-OUT pads, at least one of which is a slow, and therefore in any given application, the number of flip flops like 20(1) and 20(2) correspond to the number of slow Scan-OUT pads, while the number of multiplexers like 20(*m*−10) and 20(*m*) correspond to the number of fast Scan-OUT pads.

A shift clock signal Shift_CLK is generated by an on-chip clock controller (OCC) 15 based upon a fast clock signal Fast_CLK and an automated test equipment (ATE) clock signal ATE_CLK, used during shift.

A clock gate (CG) 16 passes the shift clock signal Shift_CLK when enabled by an enable signal EN. A multiplexer 17 receives the output of the clock gate 16 at its first input and the ATE clock signal ATE_CLK at its second input. When the accumulator unload signal Acc_Unload_En is asserted, the multiplexer 17 passes its second input (the output from clock gate 16) to its output as the clock signal CLK2, and otherwise passes its first input (the ATE clock) to its output.

The accumulator 18 receives the first and second portions of the output scan data from the scan compressor 14 and is clocked by the second clock signal CLK2 generated as the output of the multiplexer 17.

The relationship between the shift clock Shift_CLK (ATE_CLK during scan), the first clock signal CLK1 (used to clock the flip flops associated with the Scan-OUT pads operable at a maximum frequency equal to the second frequency), the second clock signal CLK2 (used to clock the flip flops associated with the Scan-OUT pads operable at a maximum frequency equal to the second frequency) when Acc_Unload_En is deasserted during scan-shift, and the second clock signal CLK2 when Acc_Unload_En is asserted to unload the accumulator 18 may be observed in FIG. 3. Observe that the first clock signal CLK1 is the equivalent of the shift clock signal Shift_CLK, but with every other pulse having been skipped. Likewise, observe that the second clock signal CLK2, during scan-shift (Acc_Unload_En is deasserted), is equivalent to the first clock signal CLK1 but with a full period phase shift having been applied, however during unloading of the accumulator 18 (Acc_Unload_En is asserted), the second clock signal CLK2 is equivalent to the shift clock signal Shift_CLK.

Operation is now described. During scan-out, each of the scan chains 13(1), ..., 13(*n*) is operated at the first frequency (e.g., ATE_CLK serving as Shift_CLK, operating at the higher frequency). Consider the output scan data to be divided into m portions, with m in this example being four such that the output scan data is comprised of a first portion, a second portion, a m−1th portion, and an mth portion.

During an initial portion of scan-shifting, Acc_Unload_En is deasserted, and therefore the multiplexers 20(*m*−1) and 20(*m*) select their second inputs (e.g., those connected to respective outputs of the scan compressor 14) for passage to the Scan-OUT pads 21(*m*−1) and 21(*m*). Therefore, during this initial portion of scan-shifting during which Acc_Unload_EN is deasserted, the m−1th portion of the output scan data is shifted out through the Scan-OUT pad 21(*m*−1) at the first frequency while the mth portion of the output scan data is shifted out through the Scan-OUT pad 21(*m*) at the first frequency.

Acc_Unload_En being deasserted also has the effect permitting the outputs of the AND gates 19(1) and 19(2), which clock the flip flops 20(1) and 20(2), to follow the clock signal CLK1. Therefore, since the bits of the first portion of the output scan data are provided to the data input of the flip flop 20(1) but the flip flop 20(1) is clocked by CLK1 (which, as explained, is equivalent to Shift_CLK but with every other pulse skipped), every other bit of the first portion of the output scan data is output via the Scan-OUT pad 21(1) during the initial portion of scan-shifting.

Another effect of Acc_Unload_En being deasserted is to cause the multiplexer 17 to select the output of the clock gate 16 for passage as the clock signal CLK2 used to clock the accumulator 18. Keeping in mind that the clock signal CLK2 is considered to be equivalent to the clock signal CLK1 with a full period shift having been performed. Therefore, during clock pulses of the shift clock during which there is no clock pulse of the clock signal CLK1, the clock signal CLK2 is pulsed. As a result, the accumulator 18 accumulates those bits of the first portion of the output scan data that were provided to the data input of the flip flop 20(1) during pulses of Shift_CLK where CLK1 was not pulsed. Similarly, since the bits of the second portion of the output scan data are provided to the data input of the flip flop 20(2) but the flip flop 20(2) is clocked by CLK1, every other bit of the second portion of the output scan data is output via the Scan-OUT pad 21(2) during the initial portion of scan-shifting, while the accumulator 18 accumulates those bits of the second portion of the output scan data that were provided to the data input of the flip flop 20(2) during pulses of Shift_CLK where CLK1 was not pulsed.

Therefore, at the end of the initial portion of the scan-shifting, each bit of the m−1th and mth portions of the output scan data have been shifted out, and every other bit of the first and second portions of the output scan data have been shifted out.

This is graphically represented in FIG. 4. Consider the first portion of the output scan data to contain bits A1-A8, the second portion of the output scan data to contain bits B1-B8, the m−1th portion of the output scan data to contain bits C1-C8, and the mth portion of the output scan data to contain bits D1-D8. Therefore, during the initial portion of the scan-shifting, bits C1-C8 are shifted out through the Scan-OUT pad 21(m−1) and bits D1-D8 are shifted out through the Scan-OUT pad 21(m), while bits A1, A3, A5, A7 are shifted out through the Scan-OUT pad 21(1) and bits B1, B3, B5, B7 are shifted out through the Scan-OUT pad 21(2). At the end of the initial portion of the scan-shifting, the accumulator 18 therefore stores bits A2, A4, A6, A8 and B2, B4, B6, B8.

The final portion of the scan-shift (e.g., unloading of the accelerometer 18) now begins with Acc_Unload_En being asserted, blocking passage of CLK1 through AND gates 19(1) and 19(2) to cease clocking of the flip flops 20(1) and 20(2), and switching the multiplexers 20(m−1) and 20(m) to pass their first inputs (received as outputs of the accumulator 18) as output. Acc_Unload_En being asserted also causes the multiplexer 17 to pass the ATE clock ATE_CLK as the second clock CLK2 to clock the accumulator. The accumulator 18 therefore outputs its stored bits through the multiplexers 20(m−1) and 20(m) to the Scan-OUT pads 21(m−1) and 21(m) at the first frequency.

This is graphically represented in FIG. 5. Recall that the accumulator 18 had stored bits A2, A4, A6, A8 and B2, B4, B6, B8 by the end of the initial portion of the scan-shifting. Therefore, during the final portion of the scan-shift, bits A2, A4, A6, A8 are shifted out through Scan-OUT pad 21(m−1) while bits B2, B4, B6, B8 are shifted out through Scan-OUT pad 21(m).

While this results in the production of a different pattern of scan out data, automated test equipment performing the scan testing on the IC has advance knowledge of what the expected resulting pattern of scan out data will be, and therefore testing is not negatively impacted.

The time for the performance of the final portion of the scan-shift (e.g., unloading of the accumulator) may be during scan, with additional cycles being added during scan. The addition of the extra shift cycles should not be counterproductive compared to using a prior art scan-shift technique (e.g., the addition of the extra shift cycles should not yield a total time to unload the scan chain in excess of what it would be using a prior art scan-shift technique).

Shown in the chart of FIG. 6 are examples of the savings in scan-shift time through the use of the IC 10' as opposed to a prior art design. In this example, the length of the scan chains is 100, the maximum operating frequency of the fast Scan-OUT pads is 100 mHz, and the maximum operating frequency of the at least one slow Scan-OUT pad is 50 mHz.

Using a prior art design, as long as there is at least one slow Scan-OUT pad, the time to unload all of the scan chains 13(1), . . . , 13(n) is set by the frequency of the slow Scan-OUT pad (i.e., operated at the second frequency). Using the design of FIG. 2, however, the time to unload all of the scan chains 13(1), . . . , 13(n) is equal to the time to unload the scan chains connected to the fast Scan-OUT pads (performed at the maximum frequency of the fast Scan-OUT pads) plus the time to unload the accumulator (also performed via the fast Scan-OUT pads and at the maximum frequency thereof), which is substantially less than the time to unload all scan chains at the frequency of the slow Scan-OUT pad. Observe in the chart that as the number of slow Scan-OUT pads grow in comparison to the number of fast Scan-OUT pads, the accumulator unload time increases, however, even in the case where half of the Scan-OUT pads are slow pads, there is still a 25% savings in total time. In the case of a single slow Scan-OUT pad, there is nearly a 50% savings in total time.

Variations are within the scope of this disclosure. Shown in FIG. 7 is an embodiment of the integrated circuit 10" in which unloading of the accumulator 18 is through the Scan-OUT pads 21(1) and 21(2) as well as the Scan-OUT pads 21(m−1) and 21(m). To facilitate this, the flip flops 20(1) and 20(2) are clocked by the first clock CLK1 even when Acc_Unload_En is asserted. The data input to the flip flop 20(1) is received from the output of a multiplexer 22(1), which has a first input receiving output from the accumulator 18, a second input receiving output from the scan compressor 14, and its selection set by Acc_Unload_En. Likewise, the data input to the flip flop 20(2) is received from the output of a multiplexer 22(2), which has a first input receiving output from the accumulator 18, a second input receiving output from the scan compressor 14, and its selection set by Acc_Unload_En.

In operation, during the initial portion of the scan-shift, flip flops 20(1) and 20(2) will be clocked by the first clock signal CLK1 and will receive their data inputs from the scan compressor 14, no differently than in the embodiment of FIG. 2. However, during the final portion of the scan-shift, flip flops 20(1) and 20(2) will also be clocked by the first clock signal CLK1 and will receive their data inputs from the accumulator 18. Therefore, the accumulator 18 outputs its stored bits through the multiplexers 20(m−1) and 20(m) to the Scan-OUT pads 21(m−1) and 21(m) at a rate set by CLK2 (equal to Shift_CLK at this point), as well as through the multiplexers 22(1) and 22(2) to the Scan-OUT pads 21(1) and 21(2), at a rate set by CLK1.

This is graphically represented in FIG. 8. Recall that the accumulator 18 had stored bits A2, A4, A6, A8 and B2, B4, B6, B8 by the end of the initial portion of the scan-shifting. Therefore, during the final portion of the scan-shift, bits A2, A6 are shifted out through the Scan-OUT pad 21(1), bits A4, A8 are shifted out through the Scan-OUT pad 21(2), bits B2, B6 are shifted out through the Scan-OUT pad 21(m−1), and bits B4, B8 are shifted out through the Scan-OUT pad 21(m).

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. An integrated circuit, comprising:
a scan compressor configured to compress output scan data as the output scan data is shifted out from scan chains;
a plurality of scan-out pads, wherein a first group of the plurality of scan-out pads operates at a first scan frequency, and a second group of the plurality of scan-out pads operates at a second scan frequency that is lower than the first scan frequency;
first scan-out circuitry configured to shift a first portion of the output scan data out through the first group of the plurality of scan-out pads at the first scan frequency;
second scan-out circuitry configured to shift every other bit of a second portion of the output scan data out through the second group of the plurality of scan-out pads at the second scan frequency; and
an accumulator configured to accumulate bits of the second portion of the output scan data that were not shifted out through the second group of the plurality of scan-out pads;
wherein the first scan-out circuitry is further configured to, after shifting out the first portion of the output scan data at the first scan frequency, shift at least a portion of the accumulated bits out through the first group of the plurality of scan-out pads at the first scan frequency.

2. The integrated circuit of claim 1, further comprising clock generation circuitry configured to generate a shift clock signal used to clock the scan chains and a second clock signal used to clock the accumulator; and wherein the second scan-out circuitry is clocked by a first clock signal.

3. The integrated circuit of claim 2, wherein the clock generation circuitry generates the second clock signal as being equal to the shift clock signal when the first scan-out circuitry shifts at least the portion of the accumulated bits out through the first group of the plurality of scan-out pads, but otherwise generates the second clock signal as being a pulse-skipped version of the shift clock signal, equivalent to the shift clock signal but with every other clock pulses being skipped, and equivalent to the first clock signal phase shifted by a full period.

4. The integrated circuit of claim 2, wherein the clock generation circuitry generates the second clock signal as being equal to the shift clock signal when the first scan-out circuitry shifts at least the portion of the accumulated bits out through the first group of the plurality of scan-out pads, but otherwise generates the second clock signal as being a pulse-skipped version of the shift clock signal, equivalent to the shift clock signal but with every other clock pulse being skipped, and equivalent to the first clock signal phase shifted by a full period.

5. The integrated circuit of claim 3, wherein the first scan-out circuitry comprises:
multiplexers having a first inputs coupled to receive the first portion of the output scan data from the scan compressor, second inputs coupled to the accumulator to receive the accumulated bits therefrom, and outputs coupled to respective ones of the first group of the plurality of scan-out pads, wherein selection of which of the first and second inputs of the multiplexers are passed to the output is performed based upon an accumulator unload signal asserted when the first scan-out circuitry is to shift at least the portion of the accumulated bits out through the first group of the plurality of scan-out pads.

6. The integrated circuit of claim 5, wherein the second scan-out circuitry comprises:
flip-flops having data inputs coupled to receive the second portion of the output scan data from the scan compressor and data outputs coupled to respective ones of the second group of the plurality of scan-out pads, the flip-flops being clocked by outputs from logic gates.

7. The integrated circuit of claim 6, wherein the logic gates comprise AND gates having first inputs coupled to receive the first clock signal and second inputs coupled to receive the accumulator unload signal.

8. The integrated circuit of claim 6, wherein the logic gates comprise AND gates having non-inverting inputs coupled to receive the first clock signal and inverting inputs coupled to receive the accumulator unload signal.

9. The integrated circuit of claim 6, wherein the logic gates comprise a clock gating circuit having first inputs coupled to receive the first clock signal and second inputs coupled to receive the accumulator unload signal.

10. The integrated circuit of claim 1, wherein the first scan-out circuitry is further configured to, after shifting out the first portion of the output scan data at the first scan frequency, shift each of the accumulated bits out through the first group of the plurality of scan-out pads at the first scan frequency.

11. The integrated circuit of claim 1, wherein the second scan frequency is one-half the first scan frequency.

12. A method of performing scan-testing on an integrated circuit, comprising:
during a first operating period:
shifting scan patterns through scan chains and out through a scan compressor as output scan data;
shifting a first portion of the output scan data out through a first group of scan-out pads at a first scan frequency;
shifting every other bit of a second portion of the output scan data out through a second group of scan-out pads at a second scan frequency less than the first scan frequency; and
accumulating bits of the second portion of the output scan data that were not shifted out through the second group of scan-out pads; and
during a second operating period immediately after the first operating period:
shifting at least a portion of the accumulated bits out through the first group of scan-out pads at the first scan frequency.

13. The method of claim 12, further comprising generating a shift clock signal used to clock the scan chains and a second clock signal used to clock an accumulator performing the accumulation; and wherein the shifting out of the first portion of the output scan data is performed using a first clock signal.

14. The method of claim 13, wherein the second clock signal is generated as being equal to the shift clock signal when at least the portion of the accumulated bits out is through the first group of scan-out pads, but otherwise the second clock signal is generated as being a pulse-skipped version of the shift clock signal, equivalent to the shift clock signal but with every other clock pulse being skipped, and equivalent to the first clock signal phase shifted by a full period.

15. The method of claim 12, wherein each of the accumulated bits is shifted out through the first group of scan-out pads at the first scan frequency.

16. The method of claim 12, wherein the second scan frequency is one half the first scan frequency.

* * * * *